(12) United States Patent
Ishijima et al.

(10) Patent No.: US 9,129,775 B2
(45) Date of Patent: Sep. 8, 2015

(54) SPECIMEN POTENTIAL MEASURING METHOD, AND CHARGED PARTICLE BEAM DEVICE

(75) Inventors: Tatsuaki Ishijima, Abiko (JP); Osamu Nasu, Hitachinaka (JP); Muneyuki Fukuda, Kokubunji (JP); Takeyoshi Ohashi, Tachikawa (JP); Hiromasa Yamanashi, Sagamihara (JP); Takuji Miyamoto, Mito (JP); Kei Sakai, Hitachinaka (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 85 days.

(21) Appl. No.: 13/383,546

(22) PCT Filed: Jul. 2, 2010

(86) PCT No.: PCT/JP2010/004346
§ 371 (c)(1),
(2), (4) Date: Jan. 11, 2012

(87) PCT Pub. No.: WO2011/007517
PCT Pub. Date: Jan. 20, 2011

(65) Prior Publication Data
US 2012/0119085 A1 May 17, 2012

(30) Foreign Application Priority Data
Jul. 15, 2009 (JP) .................................. 2009-166271

(51) Int. Cl.
*H01J 37/26* (2006.01)
*H01J 37/20* (2006.01)
(Continued)

(52) U.S. Cl.
CPC .................. *H01J 37/28* (2013.01); *H01J 37/20* (2013.01); *H01J 37/266* (2013.01); *H01J 37/268* (2013.01); *G01R 29/24* (2013.01); *H01J 2237/2002* (2013.01); *H01L 22/12* (2013.01)

(58) Field of Classification Search
CPC .............................. H01J 37/266; H01J 37/268
USPC .................................. 250/252.11, 307, 440.11
See application file for complete search history.

(56) References Cited

U.S. PATENT DOCUMENTS 2,701,764 A * 2/1955 Carlson ........................ 399/168
3,256,481 A * 6/1966 Pulvari .......................... 324/458
(Continued)

FOREIGN PATENT DOCUMENTS

JP 09-171791 A 6/1997
JP 10-125271 A 5/1998
(Continued)

*Primary Examiner* — Phillip A Johnston
*Assistant Examiner* — Sean Luck
(74) *Attorney, Agent, or Firm* — Mattingly & Malur, PC

(57) ABSTRACT

The present invention has an object to perform specimen charge measurement or focusing at a high speed and with high precision also for a specimen in which fixed charge and induced charge may be mixedly present.

As one mode to achieve the object, there are proposed a specimen potential measuring method and a device to implement the method characterized in that when specimen potential information obtained by a first specimen potential measuring device disposed outside a specimen chamber or specimen potential information beforehand obtained is equal to or more than a predetermined threshold value or is more than the threshold value, measurement of specimen potential is selectively conducted by use of a second specimen potential measuring device in the specimen chamber.

11 Claims, 12 Drawing Sheets

(51) Int. Cl.
  *H01J 37/28* (2006.01)
  *G01R 29/24* (2006.01)
  *H01L 21/66* (2006.01)

(56) References Cited

U.S. PATENT DOCUMENTS

| | | | | |
|---|---|---|---|---|
| 3,874,917 | A * | 4/1975 | Wood et al. | 438/96 |
| 4,973,910 | A * | 11/1990 | Wilson | 324/457 |
| 5,486,769 | A * | 1/1996 | Chim et al. | 324/754.22 |
| 5,666,217 | A * | 9/1997 | Kaneko et al. | 349/122 |
| 6,507,474 | B1 * | 1/2003 | Singh et al. | 361/230 |
| 6,521,891 | B1 | 2/2003 | Dotan et al. | |
| 6,946,656 | B2 * | 9/2005 | Ezumi et al. | 850/11 |
| 7,408,760 | B2 * | 8/2008 | Tanimoto et al. | 361/234 |
| 7,514,683 | B2 | 4/2009 | Tanii et al. | |
| 7,851,754 | B2 * | 12/2010 | Komuro et al. | 250/310 |
| 2004/0129890 | A1 * | 7/2004 | Berman et al. | 250/380 |
| 2005/0016685 | A1 * | 1/2005 | Emoto et al. | 156/345.51 |
| 2007/0040118 | A1 * | 2/2007 | Cheng et al. | 250/310 |
| 2007/0235646 | A1 | 10/2007 | Tanii et al. | |
| 2008/0116375 | A1 * | 5/2008 | Ikegami et al. | 250/307 |

FOREIGN PATENT DOCUMENTS

| | | |
|---|---|---|
| JP | 2005-005151 A | 1/2005 |
| JP | 2007-53035 A | 3/2007 |
| JP | 2007-194126 A | 8/2007 |
| JP | 2007-257969 A | 10/2007 |
| JP | 2007-265833 A | 10/2007 |
| JP | 2008-64505 A | 3/2008 |
| JP | 2008-71492 A | 3/2008 |
| JP | 2009-26742 A | 2/2009 |
| JP | 2009-246012 A | 10/2009 |
| JP | 2009-277587 A | 11/2009 |
| JP | 2010-140733 A | 6/2010 |
| WO | 03/007330 A1 | 1/2003 |

* cited by examiner

FIG. 4
WAFER SURFACE POTENTIAL DISTRIBUTION
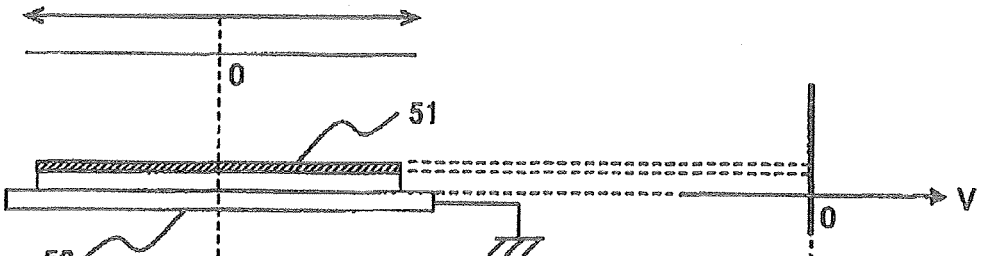
(a) WHEN ELECTRODE ON REAR SURFACE SIDE IS GROUNDED
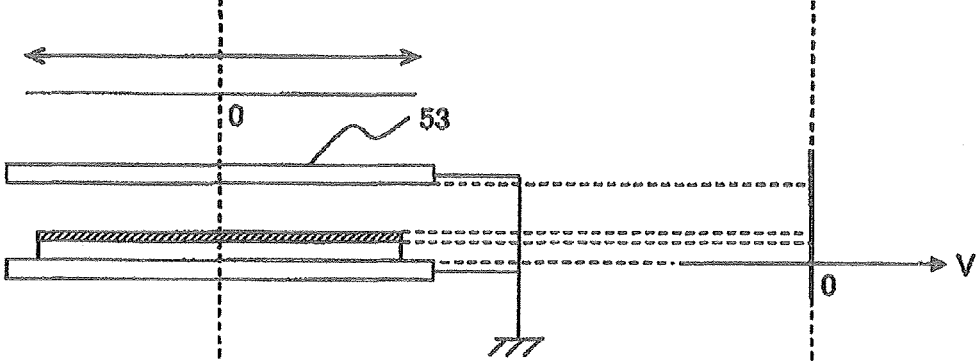
(b) WHEN ELECTRODES ON BOTH SURFACE SIDES ARE GROUNDED
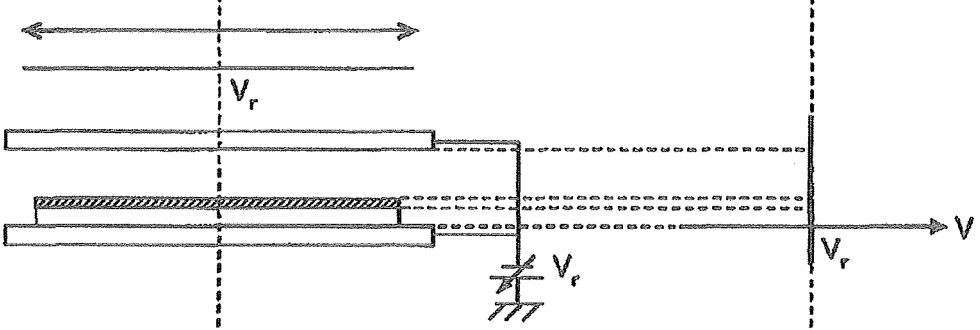
(c) WHEN ELECTRODES ON BOTH SURFACE SIDES ARE EQUAL IN POTENTIAL
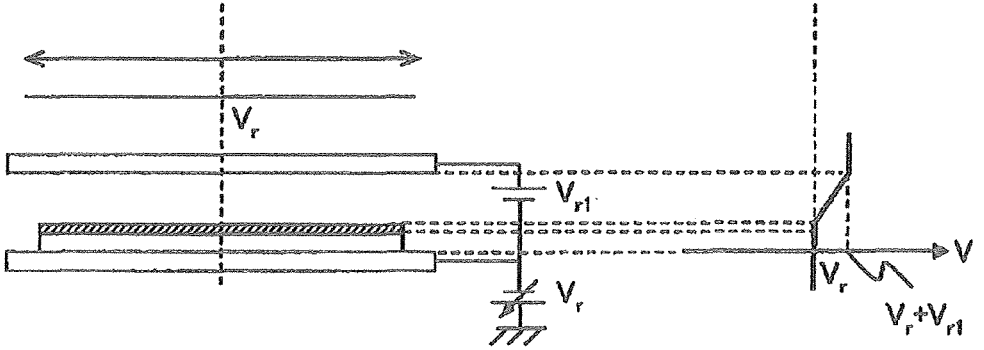
(d) WHEN FIXED POTENTIAL DIFFERENCE EXISTS BETWEEN ELECTRODES ON BOTH SURFACE SIDES

SPECIMEN POTENTIAL MEASURING METHOD, AND CHARGED PARTICLE BEAM DEVICE

TECHNICAL FIELD

The present invention relates to a charge measuring method, a focusing method, and a charged particle beam device, and in particular, to a charge measuring method, a focusing method, and a scanning electron microscope to automatically measure or observe, with high precision, dimensions and a contour of a pattern formed on a semiconductor device.

BACKGROUND ART

A charged particle beam device represented by a scanning electron microscope is a device which radiates a charged particle beam such as an electron beam onto a specimen to detect secondary electrons or the like emitted from the radiated position. By detecting the secondary electrons emitted from the specimen, measurement and/or inspection are/is carried out for a semiconductor device or the like. Since the charged particle beam device is a device to radiate particles having charge onto a specimen, if the specimen is charged, the charged particle beam emitted is also affected.

Recently, wafers having fixed charge remaining even if they are grounded have been found in various cases. It is said that causes of such fixed charge are, for example, that due to friction at coating of resist by a spin coater, a substance having polarity in the resist is polarized to fix the potential and that the charge is due to the etching process using plasma (since the fixed charge is charge fixed on the overall surface of the wafer, it will be also referred to as global charge or fixed charge depending on cases in the description below). Further, when the Silicon on Insulator (SIO) technique is employed, since an insulation film is formed on a wafer to form a semiconductor pattern on the insulation film, charge of several hundred volts may take place in some cases.

Patent literature 1 describes a scheme in which the global charge is measured before introducing a wafer into a specimen chamber and a negative voltage to be applied to the specimen is changed based on the measured global charge, to thereby adjust the focus of the electron beam. The scheme to adjust the point of focus of the electron beam by adjusting the voltage applied to the specimen is called retarding focus. This scheme has been described in patent literatures 2 and 3. In addition, a more developed scheme in which the retarding focus is conducted on the basis of quantity of secondary electrons detected by a detector has been described in patent literature 4.

CITATION LIST

Patent Literature

Patent literature 1: WO2003/007330
Patent literature 2: JP-A-10-125271
Patent literature 3: U.S. Pat. No. 6,521,891
Patent literature 4: JP-A-2007-257969

SUMMARY OF INVENTION

Technical Problem

Apart from the fixed charge described above, existence of charge induced in a certain environment has been known. The charge (to be referred to inductive charge or induced charge in some cases hereinbelow) is charge taking place in a certain specimen environment and is not measured by a simple electrometer arranged outside the specimen chamber as described in patent literature 1. Hence, the focusing on the basis of measurement by an electrometer arranged outside the specimen chamber takes a certain period of time until the just focus is obtained.

On the other hand, according to the retarding focus method described in patent literatures 2 to 4 and the like, although it is possible to monitor the quantity of charge including the induced charge in the same state as for the specimen measurement, it requires a considerable period of time to change the voltage applied to the specimen in a wide range for each of a plurality of radiation points existing on the specimen. Particularly, when presence or absence of the induced charge and the fixed charge is not confirmed, it is required to set the range of the voltage applied to the specimen in consideration of the maximum quantity of charge; there is hence room for improvement in the sense of reduction in the measurement period of time (improvement in throughput).

Next, description will be given of a method and a device having an object to conduct the specimen charge measurement or the focusing at a high speed and with high precision also for a specimen in which the fixed charge and the induced charge may be mixedly present.

Solution to Problem

As a first mode to achieve the object, there are disposed a specimen potential measuring method and a device to implement the method, characterized in that when specimen potential information obtained by a first specimen potential measuring device or specimen potential information beforehand obtained is equal to or more than a predetermined threshold value or more than the threshold value, specimen potential measurement is selectively conducted by a second specimen potential measuring device.

Further, as a second mode, there are proposed a specimen potential measuring method and a device to implement the method, characterized in that when measuring specimen potential outside a specimen chamber in which a charged particle beam is radiated, specimen potential measurement is conducted by use of a specimen potential measuring device between a specimen stage onto which the specimen is to be mounted and an electrode equal in potential to the specimen stage.

Advantageous Effects of Invention

According to the first mode described above, it is possible to measure, at a high speed and with high precision, potential of a specimen on which reduced charge may appear. That is, when the fixed charge is inherently large, the reduced charge may also appear together with the fixed charge; by selectively conducting the specimen potential measurement in this situation, the specimen potential measurement is selectively conducted according to necessity; hence, it is possible to carry out the measurement with high performance.

Additionally, according to the second mode, since the specimen charge can be measured in an environment equal to that of the specimen chamber in which the charged particle beam is radiated onto the specimen, accurate quantity of charge including the fixed charge and the reduced charge can be measured before the specimen is introduced into the specimen chamber.

BRIEF DESCRIPTION OF DRAWINGS

FIG. 4 is a diagram to explain a specimen surface potential state of a specimen which has not fixed charge and which is not covered with an insulation film.

DESCRIPTION OF EMBODIMENTS

Figure 1:
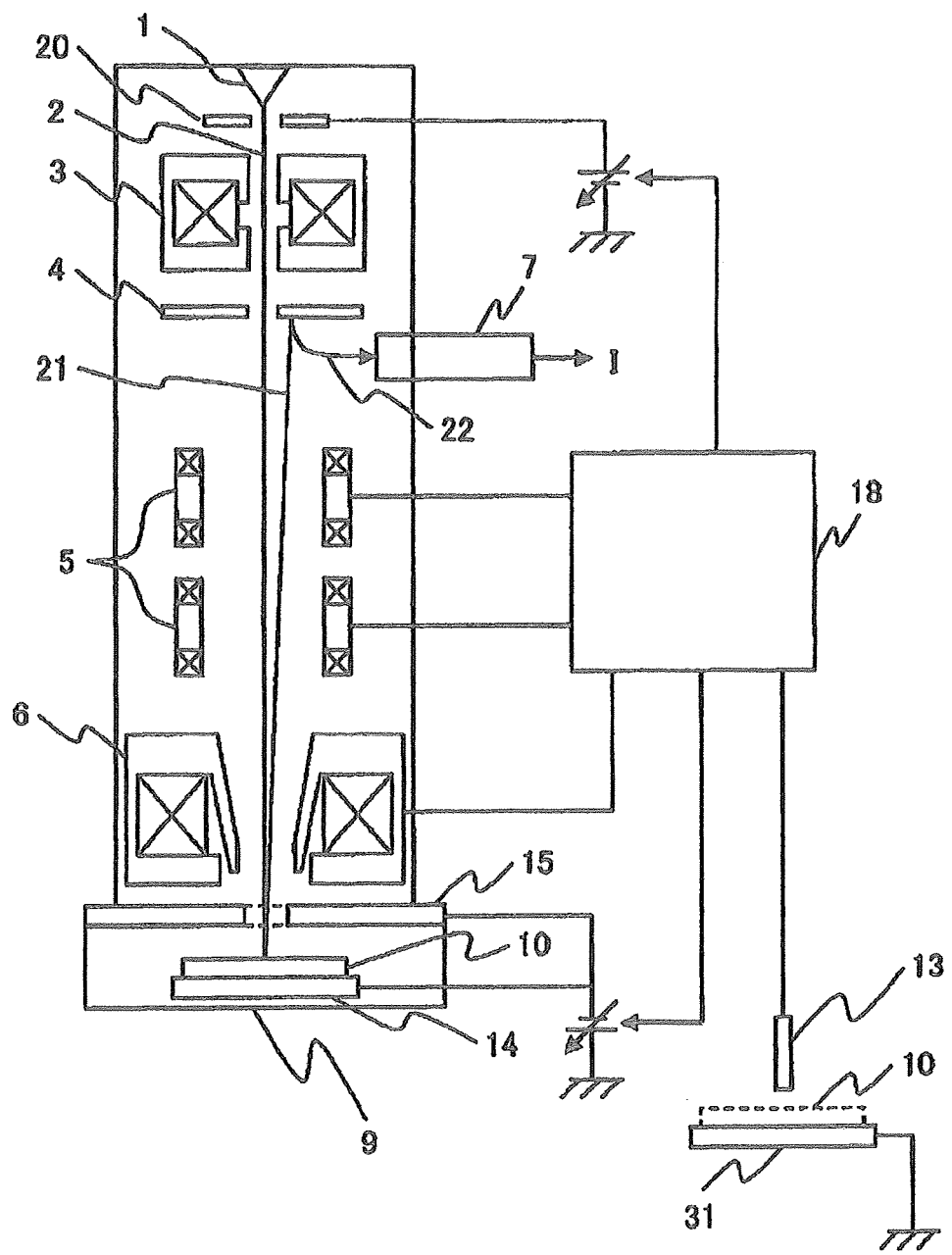
FIG. 1 is a general configuration diagram of a scanning electron microscope.

Recently, due to increasingly higher integration and finer structure of semiconductor devices, various patterns are formed on a wafer, and evaluation and measurement of contours and dimensions thereof have become more important. To automatically measure a large number of measuring points at a high speed and with high precision, it is first important whether or not detection of the measuring point can be carried out at a possibly high speed; and for this purpose, it is essential that when the measurement moves to a measuring point, the pattern is in focus.

Also, to measure dimensions of a pattern with high precision, it is required to conduct the measurement by calculating magnification of observation based on an accurate acceleration voltage in consideration of the charge voltage possessed by the wafer. In an electrooptical system, the focus condition on the wafer is determined by the electron beam acceleration voltage and the wafer height.

The arrival energy of an electron beam which arrives at a specimen is determined by a voltage employed to draw the electron beam from an electron source and to accelerate the electron beam, a retarding voltage to be applied to the wafer to decelerate the electron beam, and the charge voltage on the wafer surface. To obtain desired arrival energy regardless of the quantity of charge and the like, there exists a technique to control the retarding voltage according to the wafer charge voltage and the like with the drawing voltage and the like kept constant; this is applied to the focusing of the electron beam in the retarding focus method described above.

In the retarding focus, the focus condition is changed by changing the retarding voltage while keeping constant the voltage used to draw an electron beam and to accelerate the electron beam; and by use of the retarding voltage, the drawing voltage value, and the wafer height obtained when the wafer is in focus, the wafer charge voltage at the measuring point is reversely calculated.

Recently, wafers having fixed charge remaining even if they are grounded have been found in various cases. It is said that causes of such fixed charge are, for example, that due to friction at coating of resist by a spin coater, a substance having polarity in the resist is polarized to fix the potential and that the charge is due to the etching process using plasma (since the fixed charge is charge fixed on the overall surface of the wafer, it will be also referred to as global charge depending on cases in the description below). Further, when the Silicon on Insulator (SIO) technique is employed, since an insulation film is formed on a wafer to form a semiconductor pattern on the insulation film, charge of several hundred volts takes place in some cases.

On the other hand, among the wafers not having the fixed charge, there exist wafers which are not equal in potential to the specimen stage even when the retarding voltage is applied thereto. The reason is as follows; since, for example, the rear surface and side surfaces of the wafer making contact with the specimen stage are coated with the insulation film, even when the retarding voltage is applied to the insulation film, the voltage is not completely applied to the silicon substrate existing in the insulation film; hence, the wafer surface is not equal in potential to the specimen stage.

On the other hand, when the potential difference appears between the wafer surface and the specimen stage, the arrival energy of the electron beam arriving at the specimen surface varies between the specimen coated with the insulation film and the specimen not coated therewith; as a result, the optical condition of the beam varies according to the change in the state of the specimen. A scheme to obtain stable electron beam arrival energy regardless of the change in the kind of the specimen as above has been described in JP-A-9471791. According to the scheme, members mutually having the same potential are arranged over and below the wafer to form, in the periphery of the wafer, an area which is equal in potential to the retarding voltage and which has no electric field, to thereby realize the measurement and inspection using stable arrival energy regardless of the kind of the specimen.

When the wafer surface is different in potential from the specimen stage (or specimen holder), it can be virtually assumed that occurrence of the potential difference indicates a state in which charge is induced on the wafer surface. The induced charge varies depending on, for example, whether or not electrodes are arranged over the specimen as described above.

Since the cause of occurrence varies between the fixed charge and the induced charge in this way, there may also exist a wafer having both thereof and a wafer on which either one thereof is present. Since the charge obtained by superimposing the fixed charge onto the induced charge is the actual wafer surface charge, it is required to adjust the optical condition of the device by correctly confirming presence or absence of the two kinds of charges. In the specimen potential measurement using an energy filter and the retarding focus method, the measurement can be conducted with certain precision by measuring both thereof; however, in a state in which the induced charge is unknown, it is not efficient to detect the specimen potential by adjusting the energy filter and the retarding voltage, and there remains room for improvement.

In conjunction with the present embodiment, description will be given of a scanning electron microscope capable of conducting the specimen charge measurement and the focusing at a high speed and with high precision even when the fixed charge and the induced charge may be present. First, description with be given of a scheme to selectively conduct the potential measurement in the specimen chamber when it is determined that the induced charge is present.

Additionally, in conjunction with an embodiment, which will be described later, description will be given mainly of a device configuration in which electrodes are arranged on an upper side of the specimen to keep the potential difference constant between the specimen stage to fix the specimen and the electrodes, to thereby keep constant the occurrence of the induced charge regardless of magnitude of the retarding voltage to be applied to the specimen, and to substantially uniformalize the induced charge on the overall wafer surface at the same time (since the induced charge is almost fixed on the overall wafer surface, it will be referred to as offset charge depending on cases in the description below).

The description below relates mainly to the two embodiments above, and description will be given of a method of adjusting the retarding voltage based on measurement results of the fixed charge and the induced charge or of a scheme to implement the method.

Specifically, description will be given of a scheme in which the fixed charge is first measured, and if it is determined as a result that the induced charge may take place, the wafer surface charge is measured while keeping constant the potential difference between the specimen stage and the specimen upper side in the specimen chamber, to obtain the induced charge based on the difference between the surface charge and the fixed charge measured in advance.

By beforehand measuring the fixed charge and the induced charge in the configuration above to obtain, before the movement of the specimen stage is completed, the sum of the fixed charge and the induced charge at a measuring point after the movement, to accordingly adjust the retarding voltage to be applied to the specimen, it possible to radiate the electron beam onto the measuring point with a desired acceleration voltage at the same time when the stage arrives at the measuring point. Further, by measuring the height of the measuring point, it is also possible to automatically focus the electron beam on the measuring point. In addition, since the acceleration voltage can be kept constant, it is possible to calculate the correct observation magnification.

Next, description will be given of a specific embodying mode of the present embodiment by referring to the drawings.

FIG. 1 is a general configuration diagram of a scanning electron microscope. Incidentally, in the description below, a scanning electron microscope as one mode of the charged particle beam device will be introduced as an example thereof; however, it is not limitative, but a scheme, which will be described later, is also applicable to, for example, a focused ion beam device in which helium ions or liquid metallic ions are focused to be radiated onto a specimen. Primary electrons 2 drawn by a drawing electrode 20 from an electron source 1 are condensed by a condenser lens 3 to be fed to a scanning deflector 5 for the two-dimensional scanning on a wafer 10. The primary electrons are decelerated by the surface potential of the specimen to which the retarding voltage is being applied, and are focused by a lens function of an objective 6 to be radiated onto the wafer.

When the primary electrons 2 are radiated onto the specimen, there appear secondary electrons 21, which are accelerated in the electron source direction by the retarding voltage. The secondary electrons 21 collide with a conversion electrode 4, and secondary electrons 22 appearing from the conversion electrode 4 as a result are captured by a secondary electron detector 7; according to quantity of these secondary electrons, an output I from the secondary electron detector 7 varies. According to the output I, luminance of a display is adjusted. Incidentally, in conjunction with FIG. 1, description has been given of an example in which the secondary electrons emitted from the specimen are once converted by the conversion electrode for the detection thereof; however, naturally, this configuration is not (imitative, but it is possible to employ a configuration in which, for example, a detection surface of an electron multiplier tube or a detector is arranged on a track of the accelerated secondary electrons or back scattered electrons.

In the specimen chamber, an electrode 15 is disposed over an upper side of the specimen, and since the same retarding voltage as for the specimen stage 14 is applied, the electric field is zero between the specimen stage and the electrode. Further, it is a feature that the electrode 15 has a sufficiently large size such that even if the specimen stage 14 moves in the specimen chamber during observation of the specimen, the wafer moves in the specimen chamber without exceeding the space of the zero electric field in any case.

The present embodiment includes a static electrometer as a first specimen potential measuring device to measure the fixed charge of the specimen. Since the fixed charge voltage of the wafer is in the contour of substantially concentric circles, the potential distribution of the overall specimen can be almost obtained by measuring the potential distribution linearly along a straight line including the central position of the wafer surface. Specifically, there is appropriately employed a method in which a probe 13 is fixed on a transport route of the wafer 10 to linearly measure the potential by use of the movement of the transport stage 31 grounded or a method in which by fixing the transport stage 31 at a position, the probe 13 for static potential measurement is linearly moved. Moreover, in a situation in which the surface potential is completely measured on the overall wafer surface, the period of time required for the measurement can be reduced by preparing a plurality of static electrometer probes.

Data of the fixed charge of the wafer 10 thus measured is fed to a charge correction controller 18. The charge correction controller 18 is configured to calculate the global charge on the overall wafer surface based on the output value from the probe 13 to control by use of a result of the calculation the negative voltage (retarding voltage) to be applied via the specimen stage to the specimen. A storage medium, not shown, is integrally arranged to store a program for the operation.

In addition, the charge correction controller 18 includes a retarding focus function to adjust the electron beam focus by controlling the apply voltage to the specimen. The charge correction controller 18 controls the specimen potential to cancel it and controls the specimen potential to maximize the sharpness and the focus evaluation value of an image formed based on the obtained secondary electrons and the like. Further, it is not required that the charge correction controller 18 is integral with the scanning electron microscope unit, and it is also possible to execute its processing by an external controller and an external arithmetic unit.

In conjunction with FIG. 2, description will be given of the potential transition of the wafer surface in a situation in which electrodes are arranged on a rear surface side or on both surface sides of the wafer having fixed charge remaining in a wafer surface layer 51 even when grounded and the potential of each electrode is changed. Part of the wafer surface to be used here is not coated with an insulation film, and conduction is established between its inside and an electrode 52 existing on the rear surface side; hence, the electrode is equal in potential to the silicon substrate in the wafer.

Under this condition, in a situation in which even the electrode 52 is grounded as shown in (a), the global charge voltage $V_{sa}$ remains on the wafer surface, even when a second electrode 53 grounded is disposed over the wafer as shown in (b), the potential of the wafer surface is kept remained substantially as $V_{sa}$. This is because the thickness of the wafer surface layer 51 is very small when compared with the distance to the electrode 53 and the wafer surface potential is almost equal to the potential difference $V_{sa}$ between the silicon substrate in the wafer and the wafer surface layer 51. In this state, even when the voltages applied to both electrodes are simultaneously changed as shown in (c) or even when the voltages applied to the electrodes are changed while the potential difference therebetween is kept unchanged as shown in (d), the potential difference between the electrode 52 and the wafer surface is kept remained substantially as $V_{sa}$.

On the other hand, in conjunction with FIG. 3, description will be given of the potential transition of a wafer in a situation in which the fixed charge is present in the wafer surface layer 51 as in the wafer of FIG. 2; however, since, for example, the contact surface with respect to the electrode 52 existing on the rear surface side is entirely covered with an insulation film, it is not possible to secure conduction between the electrode 52 and the silicon substrate existing in the wafer and they are not equal in potential to each other.

In this situation, the silicon substrate potential is not zero even if the electrode 52 is grounded as in (a); however, since the fixed potential difference $V_{sa}'$ remains between the silicon substrate and the wafer surface layer 51 in the wafer, the wafer surface potential is resultantly $V_{sa}$.

In addition, when another electrode 53 grounded is arranged on the upper side of the wafer, the potential difference between the electrode 52 and the silicon substrate varies while the fixed potential difference $V_{sa}'$ is kept unchanged in the wafer; hence, the wafer surface potential is changed to $V_{sa}+V_{s1}$ obtained by adding the offset charge voltage $V_{s1}$ to the global charge voltage $V_{sa}$. In this state, even when the voltages applied to both electrodes are simultaneously changed as in (c), the potential difference between the electrode 52 and the wafer surface is kept at $V_{sa}+V_{s1}$. However, in a situation in which the applied voltages are changed while the potential difference between both electrodes is kept constant as in (d), since the potential difference between the electrode 52 and the silicon substrate is adjusted again, the potential difference between the electrode 52 and the wafer surface is $V_{sa}+V_{s2}$ obtained by adding a new offset charge voltage $V_2$ to the global charge voltage $V_{sa}$.

Figure 2:
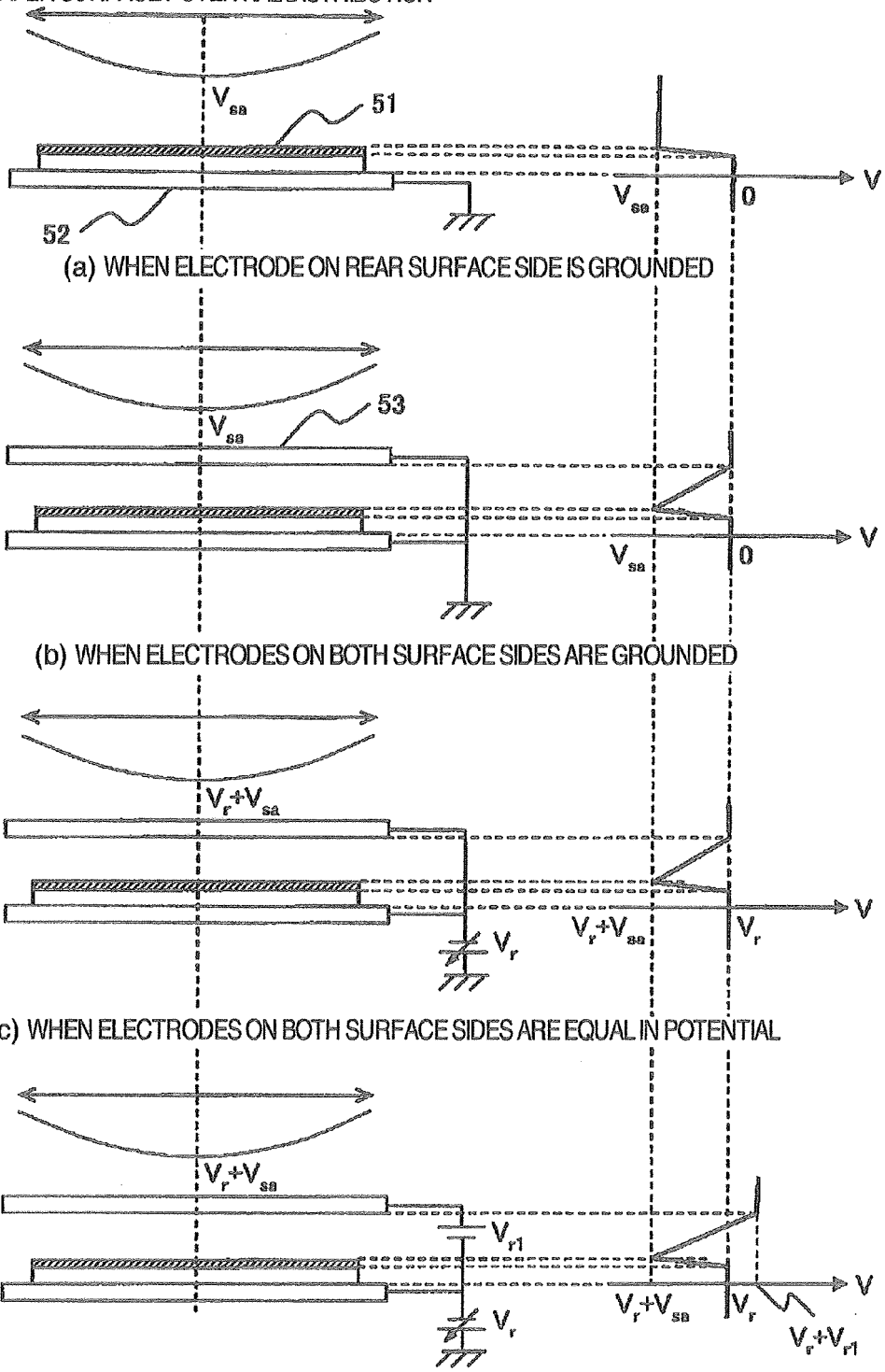
FIG. 2 is a diagram to explain a specimen surface potential state of a specimen which has fixed charge and which is not covered with an insulation film.
Figure 3:
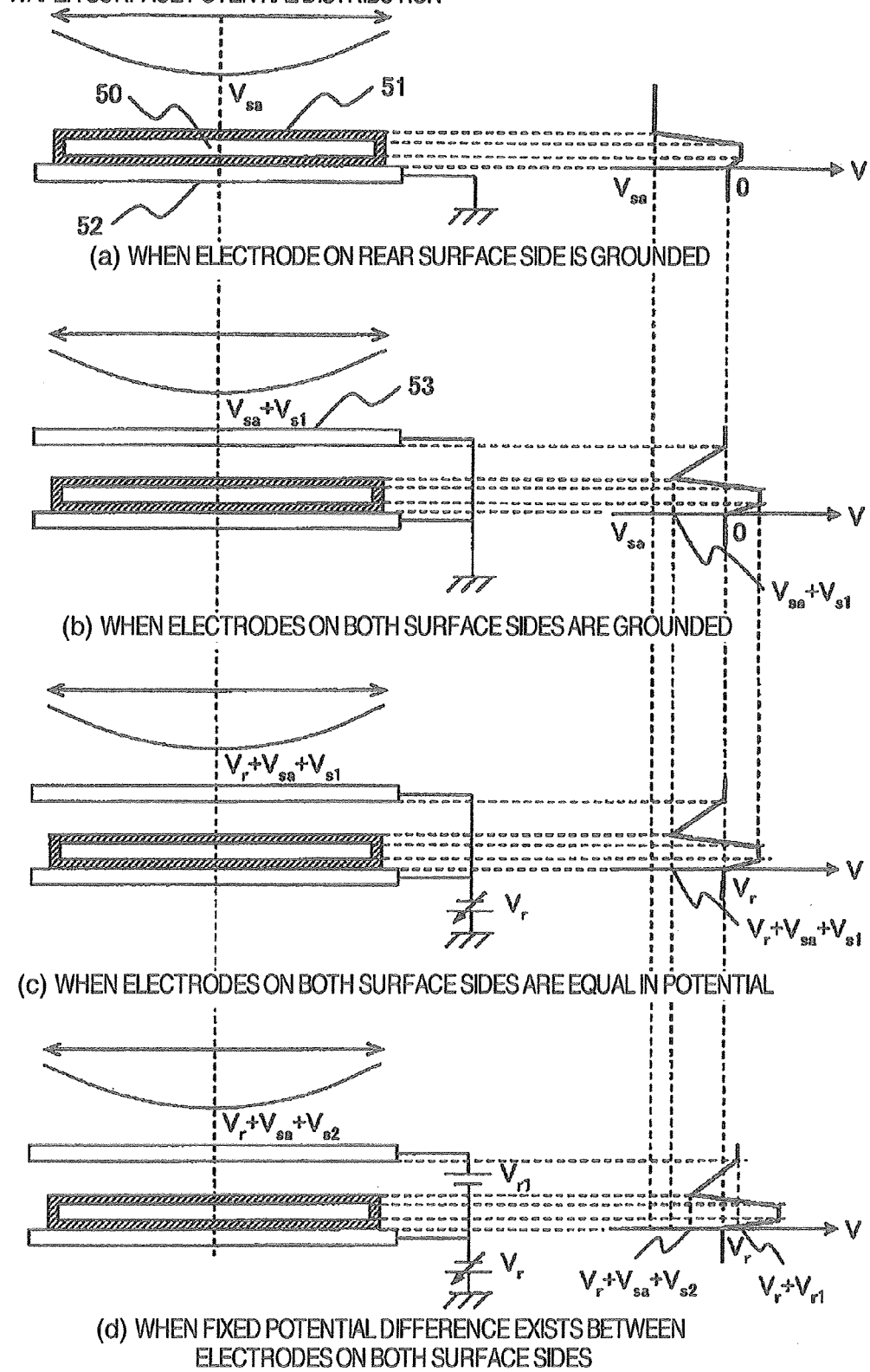
FIG. 3 is a diagram to explain a specimen surface potential state of a specimen which has fixed charge and which is covered with an insulation film.

As can be seen by comparing FIG. 2 with FIG. 3, under a condition in which electrodes are disposed over the specimen, if the specimen is surrounded by the insulation film, the offset charge voltage $V_{s1}$ is generated; otherwise, the offset charge voltage $V_{s1}$ is not generated.

In conjunction with FIG. 4, description will be given of the potential transition when conduction is established between the inside of a wafer having little fixed charge and the electrode 52 existing on the rear surface side. The electrode 52 is equal in potential to the silicon substrate in the wafer and the potential difference between the silicon substrate and the wafer surface layer 51 is kept as zero; hence, the potential on the wafer surface is independent of the potential of the electrode 53 disposed on the upper side of the wafer and is equal in potential to the electrode existing on the wafer rear surface side in any situation.

Figure 5:
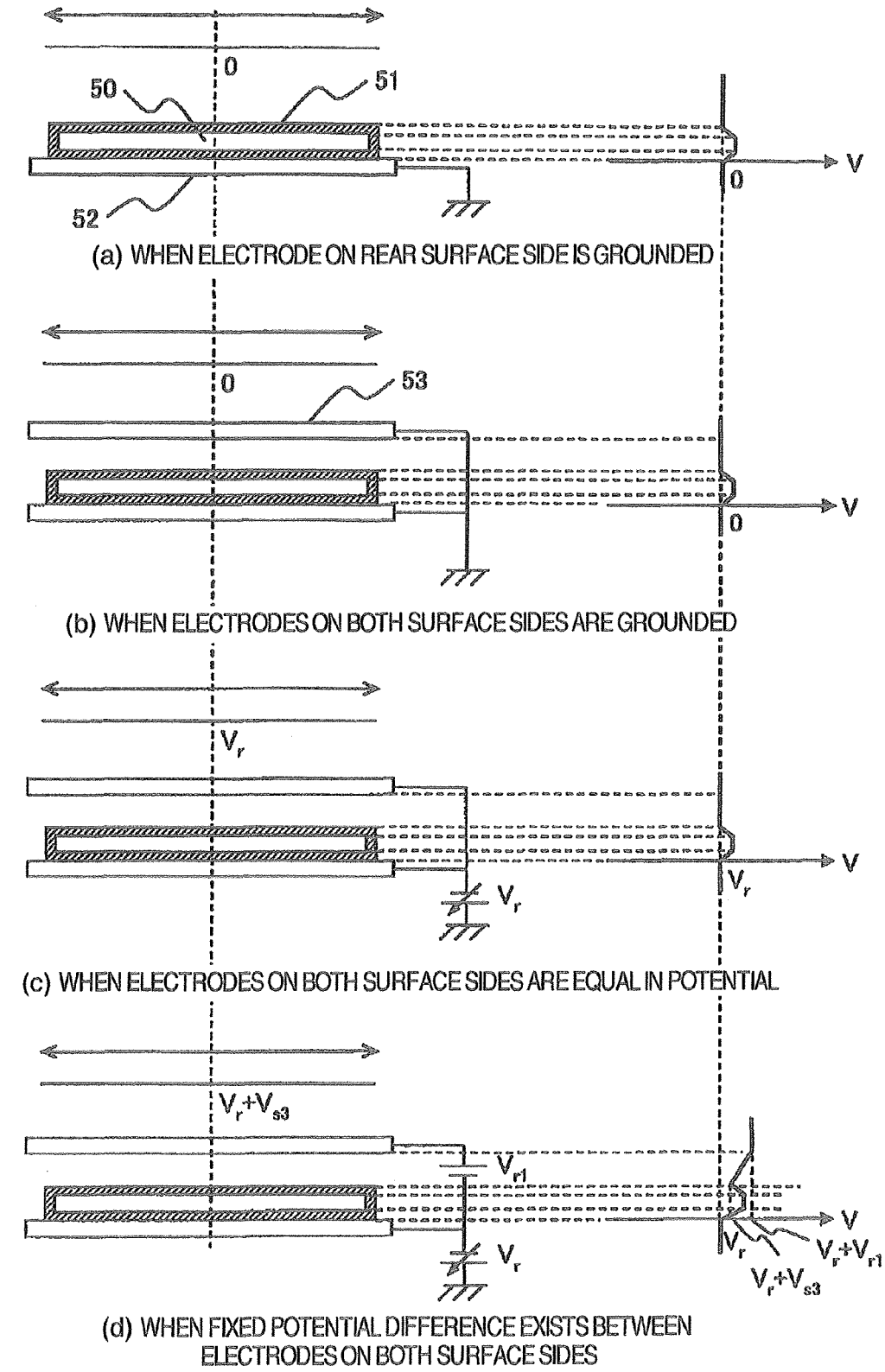
FIG. 5 is a diagram to explain a specimen surface potential state of a specimen which has not fixed charge and which is covered with an insulation film.

In conjunction with FIG. 5, description will be given of the potential transition of the wafer in a situation in which conduction is not secured between the silicon substrate in the wafer having little fixed charge and the electrode 52 and they are not equal in potential to each other. In this situation, quite a small potential difference remains between the electrode 52 grounded and the silicon substrate as in (a); however, due to, for example, cancellation by quite small potential difference $V_{sa}''$ between the silicon substrate and the wafer surface layer 51, the surface potential is resultantly zero. Further, even when another electrode 53 grounded is arranged over the wafer as in (b), the wafer surface potential is kept unchanged as zero. Under this condition, even when the voltages applied to both electrodes are simultaneously changed as in (c), the potential difference between the electrode 52 and the wafer surface is kept at zero; however, when the voltages applied thereto are changed while the potential difference therebetween is kept constant, the potential difference between the electrode 52 and the silicon substrate is adjusted, and the potential difference between the electrode 52 and the wafer surface is resultantly fixed to an offset charge voltage $V_{s3}$.

As above, as for the potential difference appearing between the electrode existing on the wafer rear surface side and the wafer surface, only in a wafer in which conduction is not established between the electrode existing on the wafer rear surface side and the inside of the wafer, almost uniformly induced charge (offset charge) appears on the overall wafer surface according to the potential condition possessed by the electrodes arranged on the rear surface side or both sides of the wafer. However, when the wafer does not have the fixed charge at the same time, the induced charge can be suppressed to zero by disposing electrodes having equal potential on both sides of the wafer as shown in (b) and (c) of FIG. 5.

Figure 6:
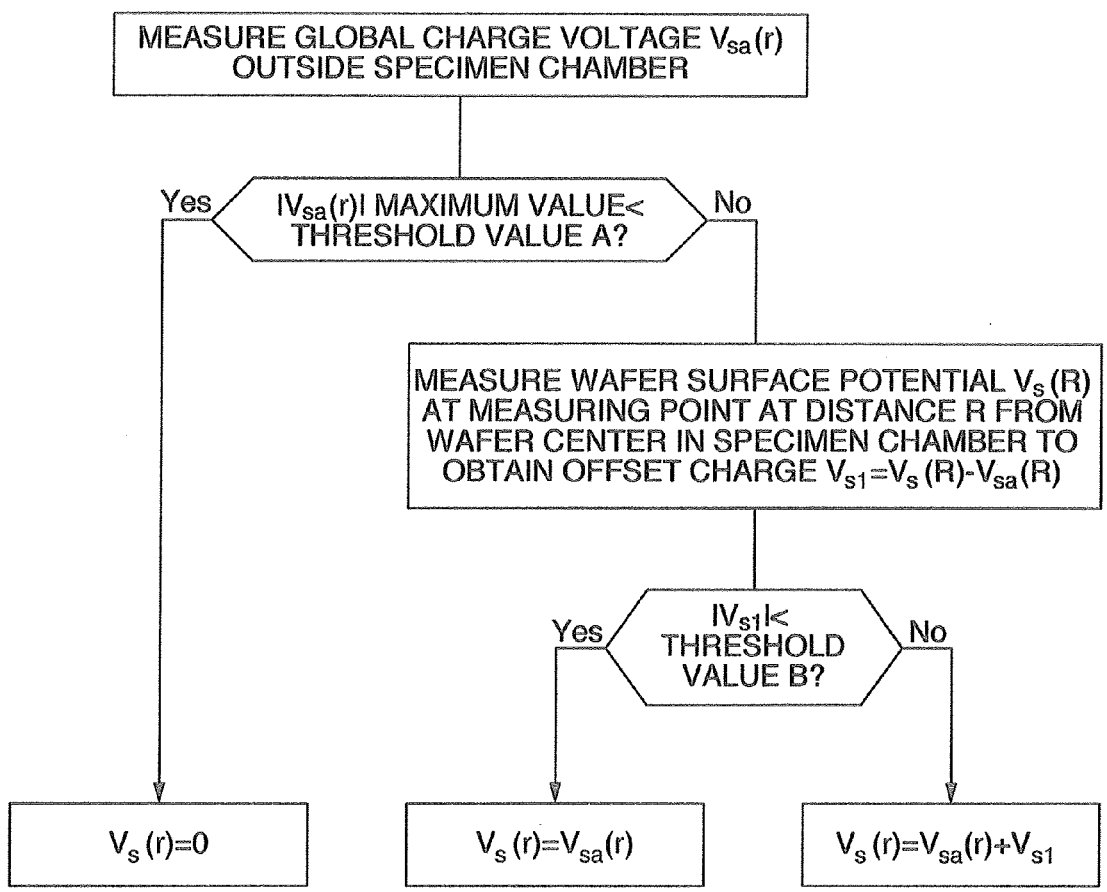
FIG. 6 is a flowchart to explain steps of determining whether or not offset charge measurement is required depending on a measurement result of global charge.

FIG. 6 shows a method of measuring the specimen surface potential at a high speed by use of these features. First, the global charge of the wafer is measured outside the specimen chamber to be approximated by an even function $V_{sa}(r)$ of the radius r relative to the wafer center. If the maximum value of the absolute value of $V_{sa}(r)$ is less than a threshold value A (or equal to or less than the threshold value A), it is determined that the wafer does not have the global charge. In this situation, as can be seen from FIGS. 4 and 5, the offset charge is also absent from the specimen chamber in which electrodes having equal potential are arranged on both sides of the wafer; hence, the wafer surface potential $V_s(r)$ is represented by expression (1).

$$V_x(r)=0 \qquad (1)$$

In other than this case, it is determined that the wafer has the global charge, and presence or absence of the offset charge is confirmed in a method below.

In the specimen chamber, the wafer surface potential $V_s(R)$ is measured at a position at distance R from the wafer center. As for a measuring method of $V_s(R)$, the measurement is possible by employing a technique using the output from the detector when the retarding voltage is gradually changed and the retarding focus of patent literature 4. In this operation, it is important that the voltages applied to the electrodes existing on both sides of the wafer are simultaneously changed and the electric field between both electrodes is kept constant in any case. The offset charge voltage $V_{s1}$ appearing in the specimen chamber is derived from expression (2).

$$V_{s1}=V_s(R)-V_{sa}(R) \quad (2)$$

If the absolute value of the offset charge voltage $V_{s1}$ is less than a threshold value B (or equal to or less than the threshold value B), it is determined that the wafer does not have the offset charge, and the wafer surface potential $V_s(r)$ in the specimen chamber is equal to the global charge voltage as represented by expression (3).

$$V_s(r)=V_{sa}(r) \quad (3)$$

In other than the case above, it is determined that the wafer has the offset charge, and the wafer surface potential $V_s(r)$ is represented by the sum of the global charge voltage $V_{sa}(r)$ and the offset charge voltage $V_{s1}$ as indicated by expression (4).

$$V_s(r)=V_{sa}(r)+V_{s1} \quad (4)$$

By conducting the specimen potential measurement and the focusing based on the determination above, it is possible to perform the specimen potential measurement and the focusing with high precision regardless of the kind of the specimen. In addition, since the quantity of fixed charge is known when the specimen is introduced into the specimen chamber, the offset charge can be detected at an earlier point of time by conducting the retarding focus on the basis of its value.

Incidentally, in the description, the offset charge voltage $V_{s1}$ is derived from the difference between the wafer surface potential $V_s(R)$ at a measuring point at distance R from the wafer center and the global charge voltage $V_s(R)$; however, when the difference between the wafer surface potential and the global charge is obtained at a plurality of measuring points to employ a mean value thereof as the offset charge voltage $V_{s1}$, it is possible to improve the measurement precision of the offset charge. Further, strictly speaking, the offset charge varies more slightly when compared with the physical change of, for example, a warp and film thickness of the wafer; hence, it is also possible that a fitting function is obtained using measurement results of the offset charge voltage at a plurality of measuring points to determine a strict offset charge voltage at a desired measuring point of the wafer. The offset charge logically appears uniformly on the overall specimen. Therefore, even in a specimen on which many radiation points exist, it is not required to measure the offset charge at all radiation points. For example, the measurement is conducted at a first one point or at a plurality of points at which the offset charge can be obtained with high precision, and then the specimen potential evaluation is conducted based on expression (4) to store the obtained value as an offset value, and the operation above is carried out for another beam radiation area; it is then possible to evaluate the correct potential while suppressing deterioration in the throughput.

Figure 8:
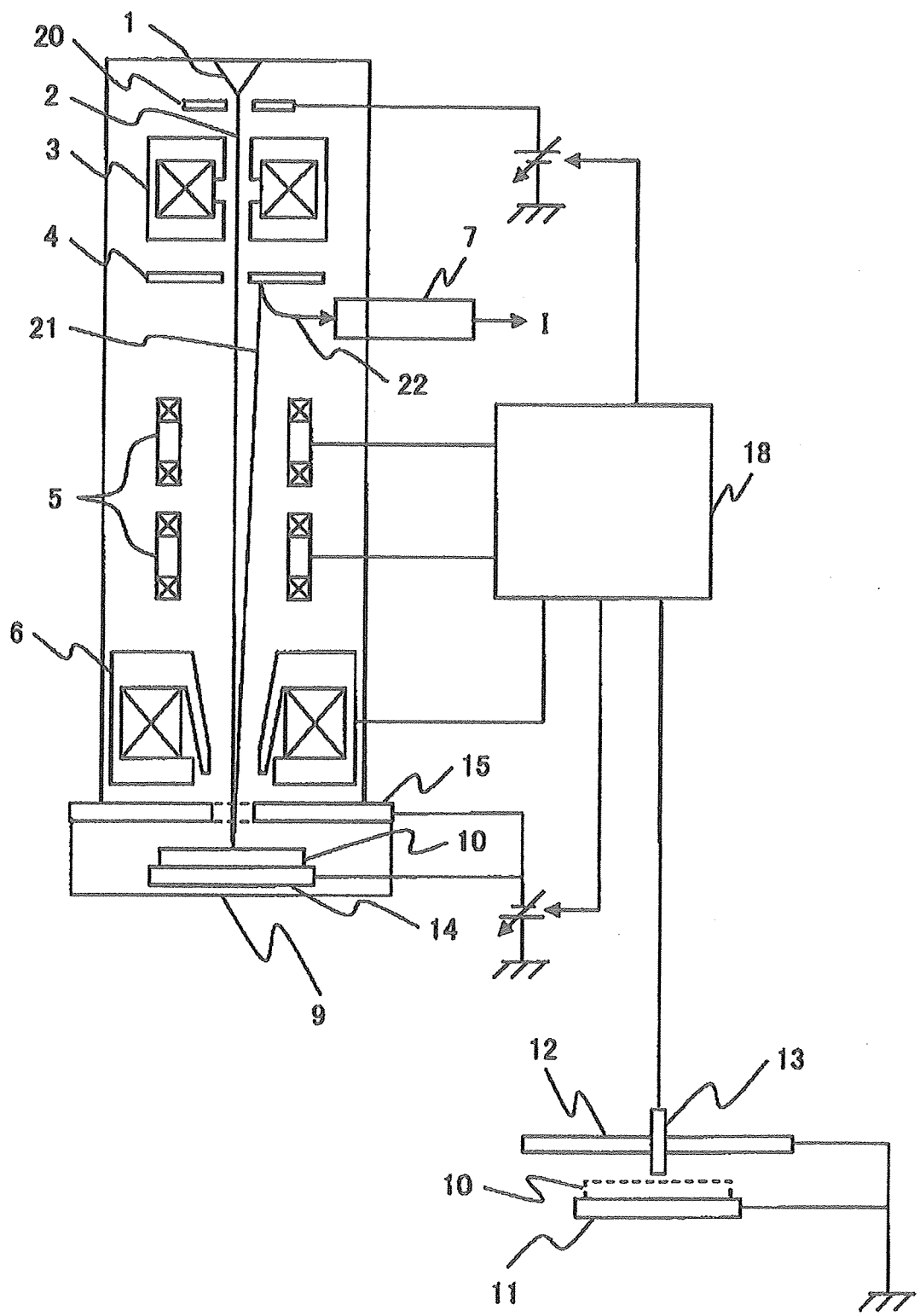
FIG. 8 is a general explanatory diagram of a scanning electron microscope including electrodes surrounding the neighborhood of a measurement area of a specimen potential measuring probe.

Also, as exemplified in FIG. 8, the measurement by the surface potential measuring device arranged outside the specimen chamber may also be conducted in an environment in which the electron beam is radiated. In this example, over the specimen, there is disposed an electrode 12 equal in potential to a transport stage 11 (the specimen stage or the electrode arranged on the specimen stage), and the electric field is zero between the transport stage and the electrode 12. The electrode 12 has a size required to prevent the wafer from exceeding the space of the zero electric field during the measurement of fixed charge.

As described above, in a situation in which the distance between the electrodes existing on both sides of the wafer at measurement of the global charge outside the specimen chamber is equal to the distance between the electrodes existing on both sides of the wafer in the specimen chamber, the offset charge voltage is always zero, as can be seen from that the potential difference between the wafer surface and the electrode on the wafer rear surface side is kept unchanged in any case as between (b) and (c) of FIGS. 2 to 5. In other words, the specimen potential including the offset charge voltage can be measured by the probe 13. As described above, the specimen is sandwiched between the electrodes having equal potential, and the specimen area thus sandwiched is measured by the probe 13 (the first specimen potential measuring device). The gap between the electrode 12 and the transport stage 11 is equal to that between the electrode 12 and the specimen stage 14 in the specimen chamber. Since it can be defined that the space between the electrode 12 and the transport stage 11 is electrically in the same environment as for the specimen chamber, the potential can be measured in the same environment as for the specimen chamber. Presence or absence of the fixed charge (+offset charge) need only be determined through comparison with a predetermined threshold value as exemplified in FIG. 6.

The wafer surface potential $V_s(r)$ is represented by expressions (1) to (3) regardless of presence or absence of conduction between the electrode on the wafer rear side and the inside of the wafer.

By separately measuring the global charge voltage and the offset charge voltage as above, the period of time required to measure the wafer surface potential $V_s(r)$ can be reduced to the maximum extent. By beforehand measuring the wafer surface potential $V_s(r)$ to adjust the retarding voltage $V_r$ by fixing the drawing voltage $V_0$ to fix the acceleration voltage $V_a$ represented by expression (5), the electron beam acceleration voltage can be kept constant.

$$V_a=V_0+(V_r-V_s(r)) \quad (5)$$

Assuming here that the retarding voltage when the wafer surface potential $V_s(r)$ is zero is $V_{r0}$, $V_r$ is represented by expression (6).

$$V_r=V_{r0}+V_s(r) \quad (6)$$

Or, to keep $V_a$ constant in expression (5), it is also possible to fix the retarding voltage $V_r$ to adjust the drawing voltage $V_0$.

Also in the description, for a wafer having the global charge voltage, presence or absence of the offset charge voltage is confirmed in any case; however, it is also possible that on the assumption that the offset charge is zero in each wafer, the surface potential of the wafer having the global charge is represented by expression (3). In this situation, the retarding voltage V, or the drawing voltage $V_0$ is adjusted to fix the acceleration voltage $V_a$ represented by expression (5) to automatically adjust the focus. Under the focus condition, automatic detection of a pattern to be measured is carried out; if the automatic detection is successfully finished, it is confirmed that the assumption is correct; conversely, if the automatic detection fails, it is likely that the assumption is wrong, that is, the focus is not obtained because the wafer has the offset charge, and the automatic detection has failed. By conducting the measurement of the offset charge $V_{s1}$ only for the wafer, it is possible to reduce the number of wafers as measurement objects of the offset charge; hence, the period of time required to measure the wafer surface potential is further reduced.

Additionally, in conjunction with the embodiment, description has been given of a device operating on the assumption that the device measures the global charge by use of the first specimen potential measuring device; however, for example, if presence of the global charge has been known, it is also possible to conduct, based on the information, the specimen potential measurement and the focusing by including the offset charge. More concretely, it is possible that the information of the global charge beforehand obtained by another potential measuring device or the like is stored in the charge correction controller 18 or the like and then such judgment as exemplified in FIG. 6 is conducted to thereby carry out the potential measurement and the like. Also, if a potential map or the like is beforehand prepared in association with kinds of specimens, the information may be employed in place of the measurement by the first specimen potential measuring device.

Figure 12:
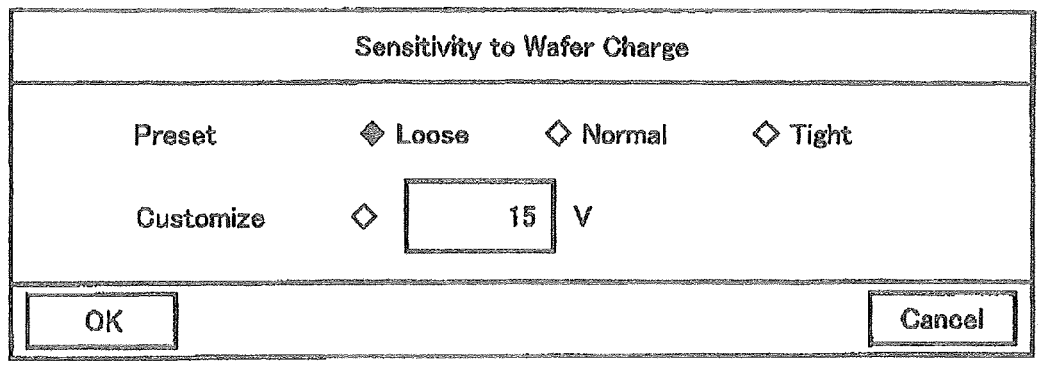
FIG. 12 is a diagram to explain an example of a GUI screen to set a threshold value as a comparison object of the global charge.

FIG. 12 is a diagram to explain an example of a Graphic User Interface (GUI) screen to set the threshold value A. The threshold value set in the operation has a standard value, but the setting may be changed according to the kind of the wafer. In the operation, magnitude of an allowance (for example, loose, normal, tight) may be set or a voltage value may be set.

Figure 13:
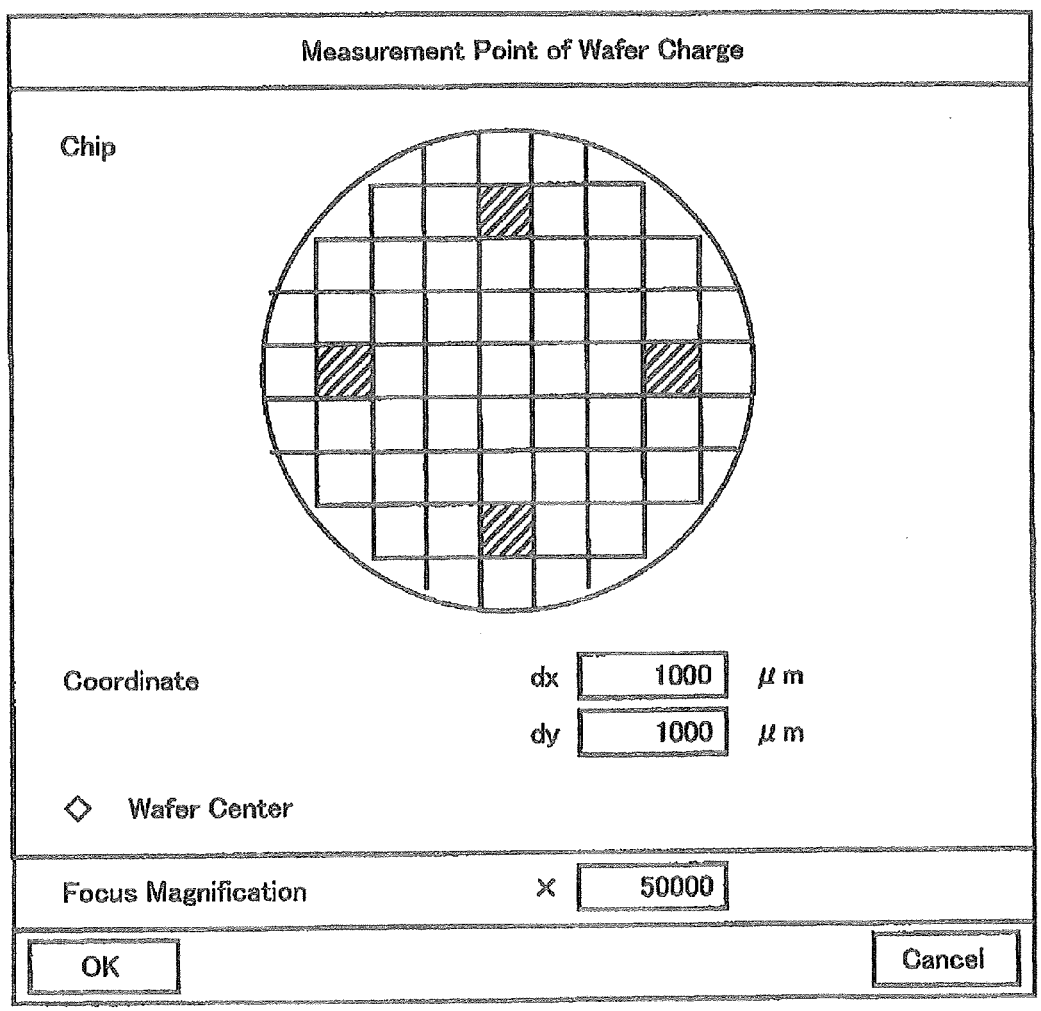
FIG. 13 is a diagram to explain an example of a GUI screen to set partitions to measure wafer surface potential.

FIG. 13 is a diagram to explain an example of a GUI screen to designate positions to measure the wafer surface potential $V_s(R)$. In this example, when "wafer center" is selected, the center of the wafer is set as the measuring point. However, there may be a case in which the charge distribution is not constant in the neighborhood of the wafer center; hence, to suppress the measurement error, a plurality of measuring points may also be designated on the basis of the setting of chips on the wafer or coordinates. By comparing the potential obtained based on such setting of measuring points with the global charge voltage, the more correct offset charge can be obtained. In this example, a chip represented by a hatched partition is defined as a measuring point. Further, a measuring partition may be set only by values of coordinates. As the number of measuring partitions becomes larger, the global charge distribution can be more correctly measured; however, on the other hand, the measuring period of time becomes longer. By making it possible to conduct the setting on the GUI screen as exemplified in FIG. 13, the operator can set a desired measuring point in consideration of the measurement precision and throughput.

Figure 7:
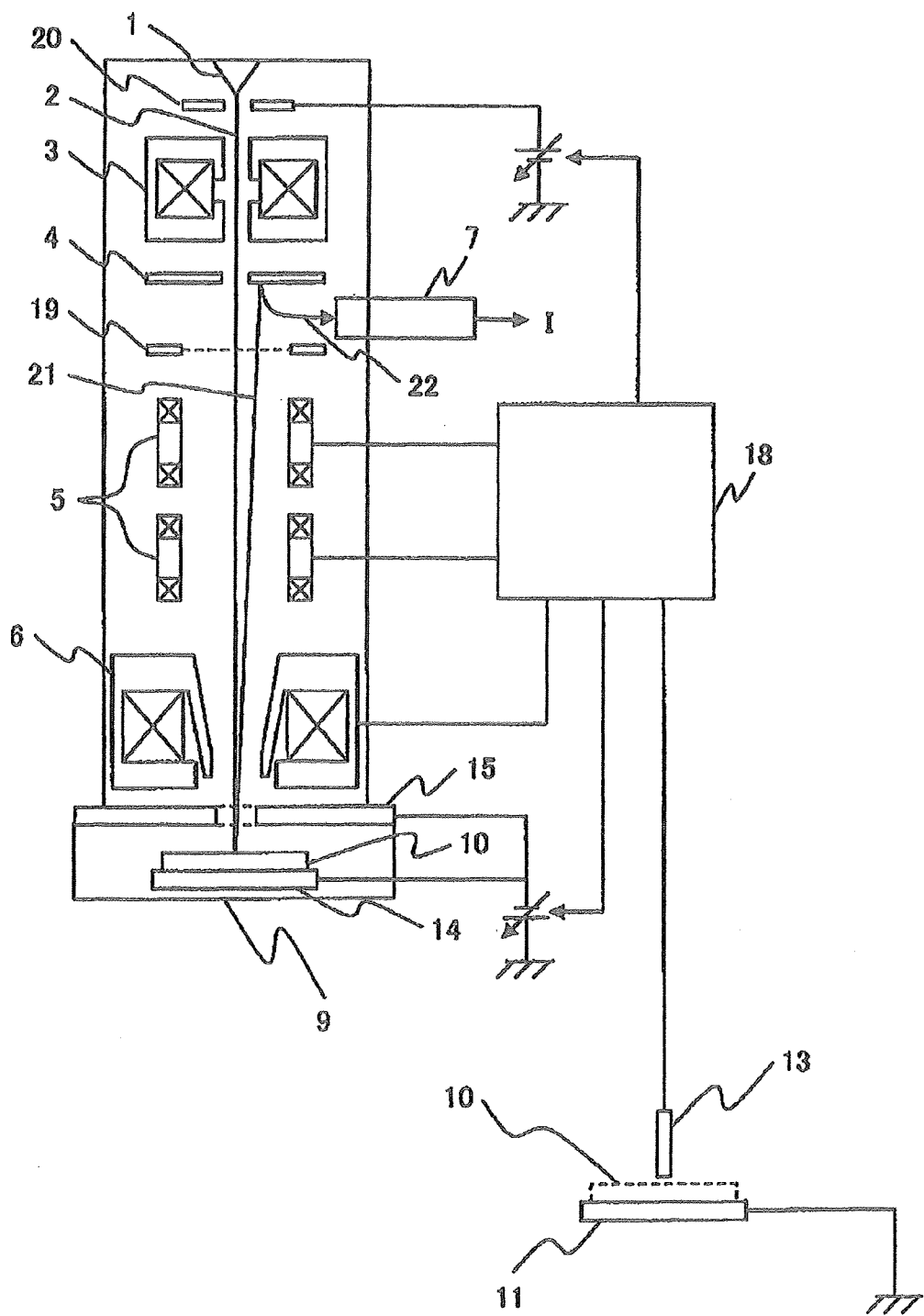
FIG. 7 is a general configuration diagram of a scanning electron microscope including an energy filter.

FIG. 7 is a general explanatory diagram of a scanning electron microscope including an energy filter. To derive the offset charge voltage $V_{s1}$ from expression (2), an energy filter 19 is disposed as a measuring unit (second specimen potential measuring device) to measure the wafer surface potential $V_s(R)$ at a position at distance R from the wafer center. When the specimen potential measurement is conducted using the energy filter, the charge voltage is a value determined based on the difference between the apply voltage $V_r$ to the specimen when the quantity of electrons obtained by a detector by sweeping the apply voltage to the energy filter or the image brightness becomes a predetermined value and the apply voltage $V_e$ to the energy filter. Also, the specimen potential may be measured by use of the scheme exemplified in patent literature 4.

Figure 9:
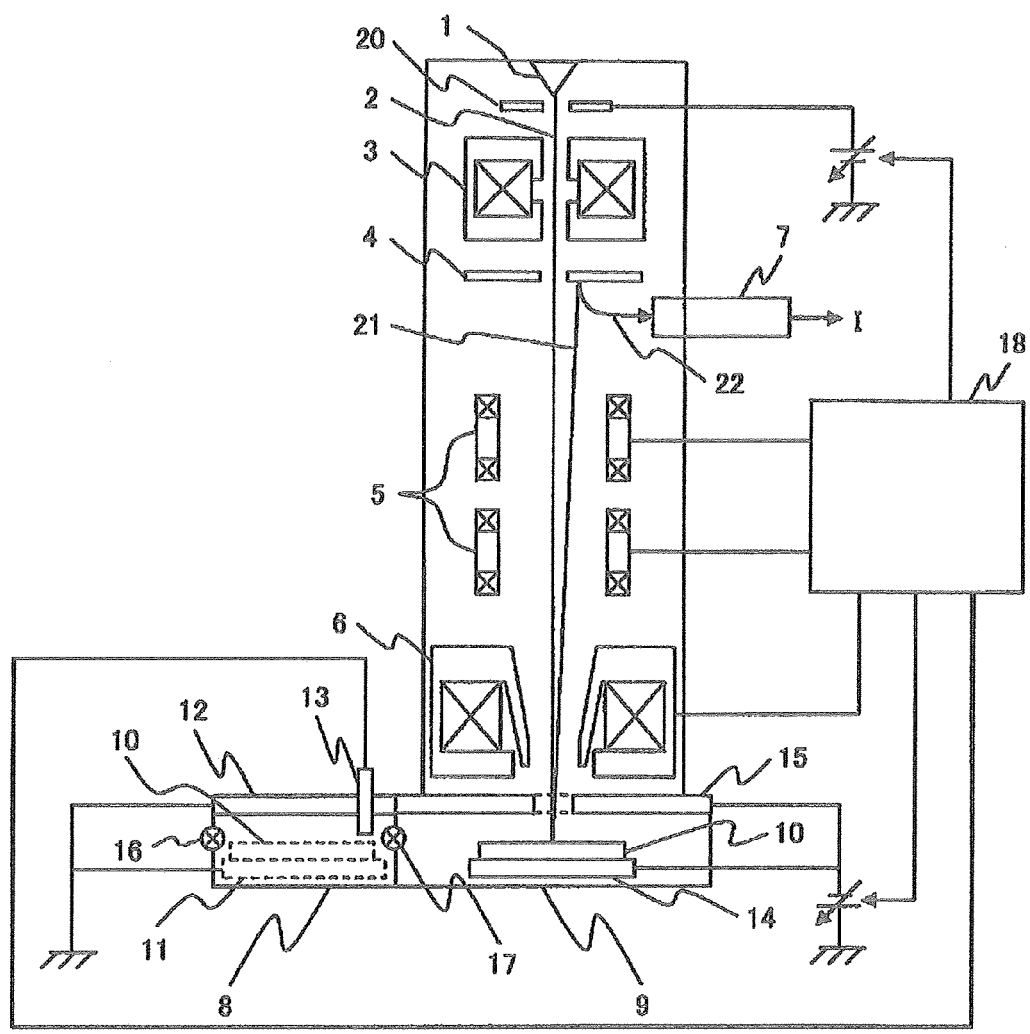
FIG. 9 is a general explanatory diagram of a scanning electron microscope in which a specimen potential measuring probe is disposed in a specimen replace chamber, the microscope including electrodes surrounding the neighborhood of a measurement area of the probe.

FIG. 9 is a general configuration diagram of a scanning electron microscope including a load lock chamber (specimen replace chamber). The wafer 10 is transported onto the transport stage 11 in the specimen replace chamber 8 through a gate valve 16 which separates the specimen replace chamber capable of keeping vacuum therein from the outside, i.e., the air. Further, the wafer is transported via a gate valve 17 into the specimen chamber 9 to be fixed on the specimen stage 14. In the configuration, the specimen stage 14 may also be the transport stage 11; in such situation, the transport stage 11 moves back and forth in the gate valve 17 together with the wafer. On the upper side of the specimen replace chamber, the probe 13 is disposed to linearly measure the wafer surface potential by using the movement of the transport stage 11. When the distance between the transport stage 11 and the electrode 12 is equal to that between the specimen stage 14 and the electrode 15, the offset charge does not take place for any wafer; hence, it is only required to measure the global charge in the specimen replace chamber. In other than this case, although the offset charge may appear, the global charge and the offset charge can be separately measured also in this situation by use of the method of FIG. 6.

Figure 10:
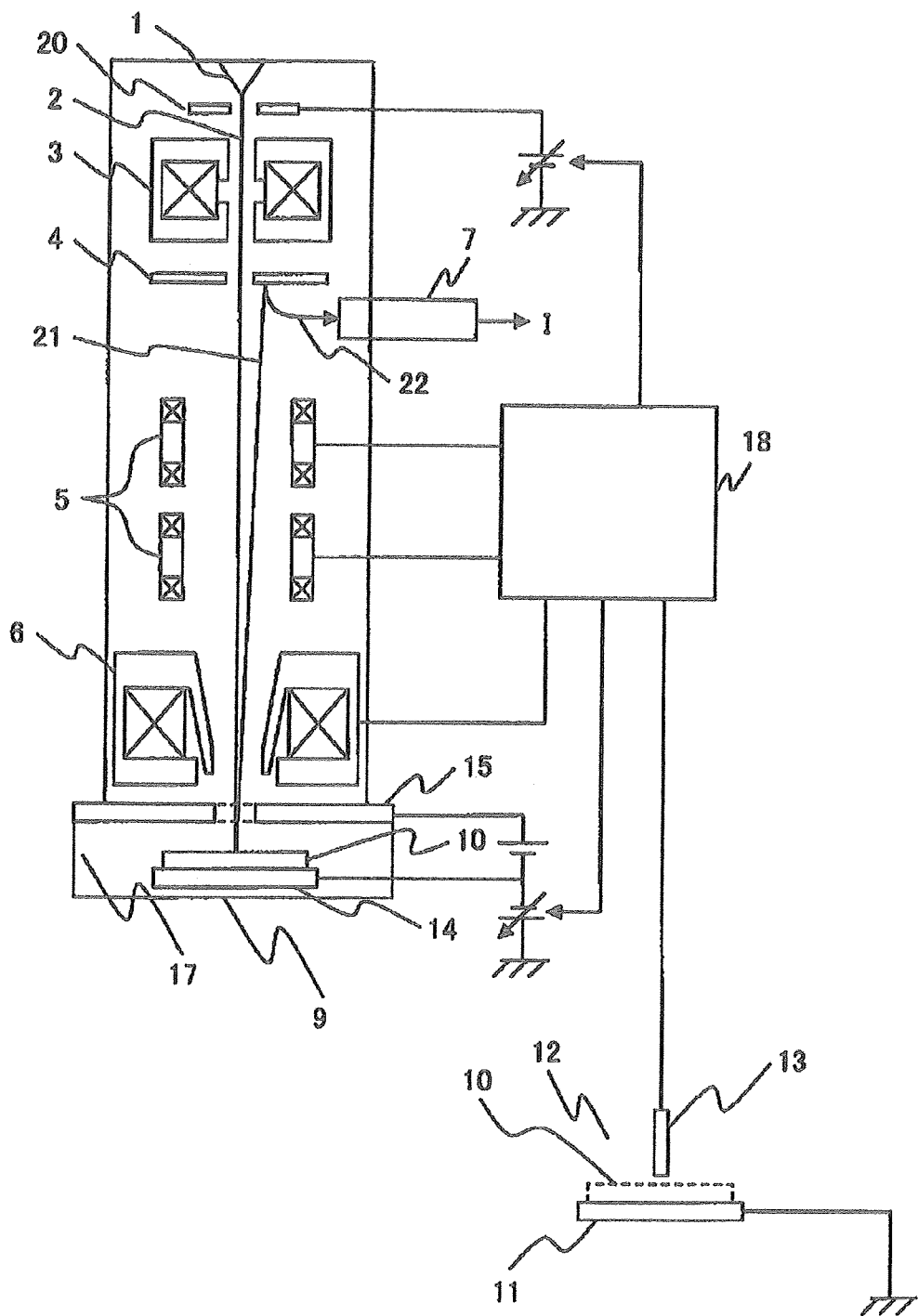
FIG. 10 is a general configuration diagram of a scanning electron microscope including electrodes to form a pickup electric field for secondary electrons.

FIG. 10 is a general configuration diagram of a scanning electron microscope including drawing electrodes to efficiently draw secondary electrons and the like to a detector arranged over an objective. In a specimen chamber, to efficiently draw secondary electrons from the specimen, fixed potential difference is provided between the wafer upper surface and its rear surface depending on cases. As can be seen by comparing (c) and (d) of FIG. 3, for a wafer which has the fixed charge and in which the contact surface to make contact with the electrode existing on the rear surface side thereof is coated with an insulation film, when comparing the case in which potential difference is present between the electrodes on both sides of the wafer with the case in which the potential difference is absent, the offset charge is larger in the case in which the potential difference is present. Also, as can be seen by comparing (c) and (d) of FIG. 5, for a wafer which has not the fixed charge and in which the contact surface to make contact with the electrode existing on the rear surface side thereof is coated with an insulation film, the offset charge takes place. Therefore, as the number of kinds of wafers in which offset charge appears becomes larger, the magnitude of the offset charge increases in the present embodiment as compared with the embodiment shown in FIG. 1.

In consequence, depending on whether or not the drawing electric field is generated for the secondary electrons, the specimen potential, or the measurement of the focus adjusting condition or the adjustment scheme is changed. Specifically, in a situation in which the drawing electric field is to be generated even if it is determined in the $|V_{sa}(r)|$ judge step in the flowchart of FIG. 6 that the $|V_{sa}(r)|$ is less than the threshold value A (it is determined that the specimen does not have the global charge), it is favorable to measure the wafer surface potential. By conducting the specimen potential evaluation or the focusing thereafter by using the measured surface potential as the offset, the specimen potential evaluation or the focusing can be carried out while suppressing reduction in the throughput.

Figure 11:
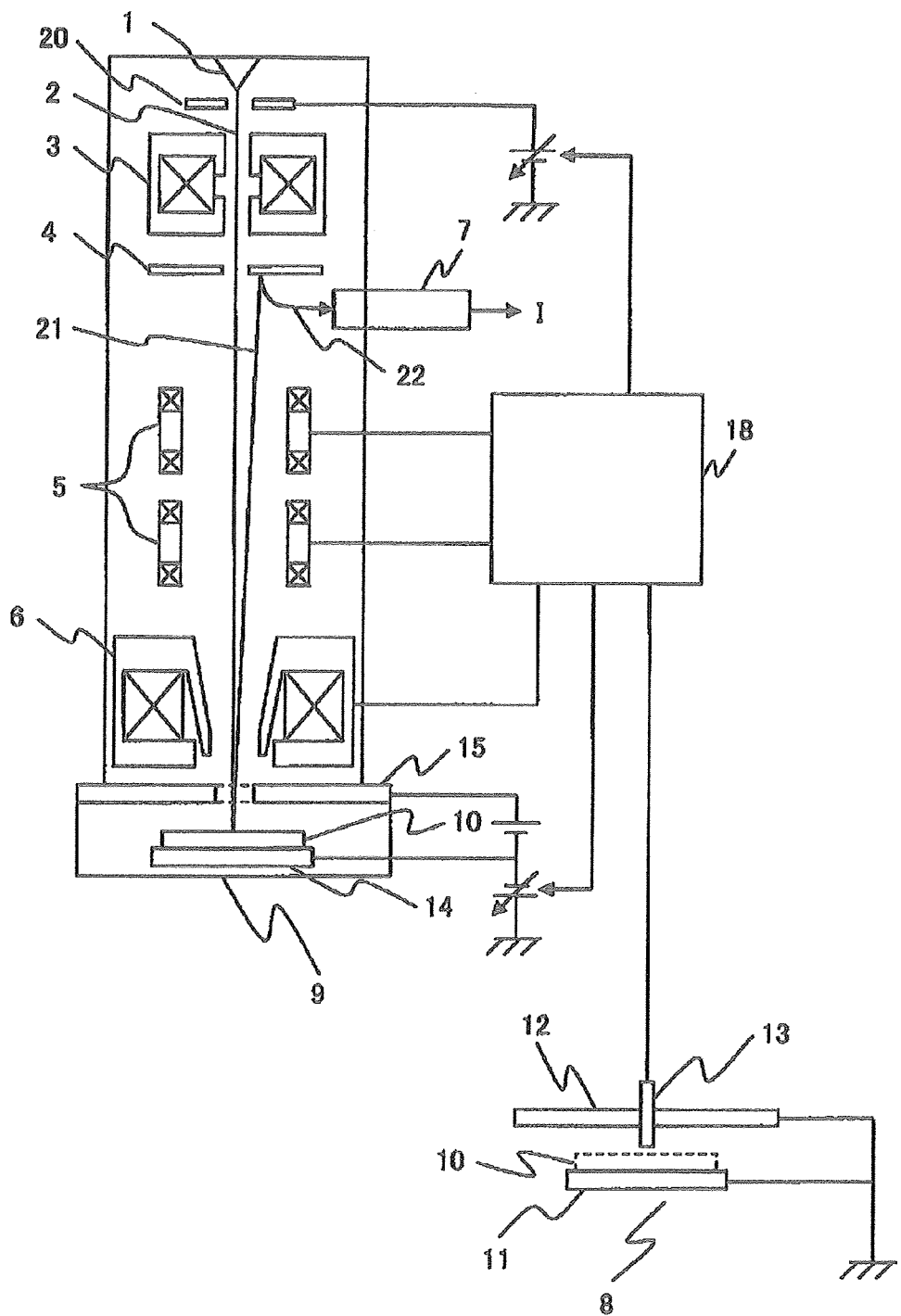
FIG. 11 is a general configuration diagram of a scanning electron microscope including electrodes to form a pickup electric field for secondary electrons and electrodes surrounding the neighborhood of a measurement area of a specimen potential measuring probe.

FIG. 11 is a diagram to explain an example in which the electrode 12 is disposed in the scanning electron microscope exemplified in FIG. 10. According to the configuration exemplified in FIG. 11, the sample potential evaluation can be conducted using the probe 13 in a state in which the electrode disposing condition is the same as for the specimen chamber; however, when forming the pickup electric field for the secondary electrodes and the like, the specimen surface potential varies depending on whether or not the specimen is coated with an insulation film. More specifically, as exemplified in FIGS. 2 and 3, when the global charge exists on the specimen, the specimen surface potential is $V_r+V_{sa}$ for the specimen for which the insulation film is not formed, and the specimen surface potential is $V_r+V_{sa}+V_{s2}$ for the specimen for which the insulation film is formed. Even if the global charge is not generated; as exemplified in FIGS. 4 and 5, the specimen surface potential is $V_r$ (FIG. 4) and $V_r+V_{r3}$ (FIG. 5), and the difference also appears.

Hence, in the charge correction controller 18, when the pickup electric field is to be formed, the specimen surface potential is measured in the specimen chamber regardless of presence or absence of the global charge, to monitor the offset value. As above, depending on presence or absence of the pickup electric field, whether or not the measurement is required is determined, which makes it possible to selectively carry out the required measurement, and it is possible to successively conduct the measurement in a state in which the high throughput is retained. Incidentally, by applying to the electrode 12 a voltage equal to the voltage applied to the electrode 15 (the voltage to pick up the secondary electrons), the specimen potential can be measured in the same environment as for the specimen chamber; hence, it is not required to measure the potential in the specimen chamber.

Further, depending on presence or absence of the insulation film, the specimen surface potential varies before and after the application of $V_{r1}$ regardless of presence or absence of the global charge; hence, the presence or absence of the insulation film may be judged based on the monitoring of the specimen surface potential before and after the application of $V_{r1}$. The information may also be stored as specimen information, for example, in a storage medium in the device.

According to the embodiment described above, it is possible to measure the wafer surface potential at a high speed by separately measuring the fixed charge inherently possessed by the specimen and the induced charge taking place in the specimen chamber, and it is possible to conduct automatic focusing and automatic detection of the measuring point at a high speed; and it is possible to measure dimensions of a pattern with high precision by calculating the observation magnification by use of the accurate acceleration voltage in consideration of the charge voltage possessed by the wafer. In addition, it is possible to appropriately carry out the specimen potential measurement by conducting the potential measurement in a state in which the environment where the specimen is arranged is the same as for the specimen chamber.

REFERENCE SIGNS LIST

1 Electron source
2 Primary electrons
3 Condenser lens
4 Conversion electrode
5 Scanning deflector
6 Objective
7 Secondary electron detector
8 Specimen replace chamber
9 Specimen chamber
10 Wafer
11 Transport stage
12, 15, 52, 53 Electrode
13 Probe
14 Specimen stage
16, 17 Gate valve
18 Charge correction controller
19 Energy filter
21 Secondary electrons
22 Secondary electrons generated from conversion electrode
51 Wafer surface layer

The invention claimed is:

1. A specimen potential measuring method of measuring a potential of a specimen by a charged particle beam device, the specimen potential measuring method comprising:
measuring, by a first specimen potential measuring device disposed outside a specimen chamber of a second specimen potential measurement device, a fixed potential of a specimen;
when the fixed potential measured by the first specimen potential measuring device is equal to or greater than a first predetermined threshold value, selectively measuring a surface potential of the specimen, by the second specimen potential measurement device inside the specimen chamber, by irradiating the specimen with a charged particle beam and obtaining an output value from a detector when a voltage applied to a specimen stage is changed and while a potential difference between a specimen stage and an electrode disposed over the specimen stage is kept constant, wherein the electrode and the specimen stage sandwich the specimen and a surface area of the electrode facing the specimen is greater than a surface area of the specimen; and
when the surface potential measured by the second specimen potential measuring device is equal to or greater than a second predetermined threshold value, applying a potential to the specimen that is a difference between the surface potential measured by the second specimen potential measuring device and the fixed potential measured by the first specimen potential measuring device as an offset potential.

2. A specimen potential measuring method of measuring a potential of a specimen by a charged particle beam device, the specimen potential measuring method comprising:
measuring, by a first specimen potential measuring device disposed outside a specimen chamber of a second specimen potential measurement device, a fixed potential of a specimen;
when the fixed potential measured by the first specimen potential measuring device is equal to or greater than a first predetermined threshold value, selectively measuring a surface potential of the specimen, by the second specimen potential measurement device inside the specimen chamber, by irradiating the specimen with a charged particle beam
and obtaining an output value from a detector when a voltage applied to a specimen stage is changed while a potential difference between a specimen stage and an electrode disposed over the specimen stage is kept constant, wherein the electrode and the specimen stage sandwich a specimen and a surface area of the electrode facing the specimen is greater than a surface area of the specimen; and
when the surface potential measured by the second specimen potential measuring device is equal to or greater than a predetermined second threshold value, applying a value of a potential for each irradiation area on the specimen obtained by adding a difference between the fixed potential and the surface potential to the fixed potential.

3. A specimen potential measuring method according to claim 1, wherein:
a voltage to be applied to the specimen is controlled to cancel the fixed potential or the surface potential.

4. A charged particle beam device comprising:
an electron source emitting a charged particle beam;
a specimen chamber in which a specimen stage holding a specimen irradiated by the charged particle beam is disposed;
an electrode disposed over the specimen stage, the electrode and the specimen stage sandwich the specimen and a surface area of the electrode facing the specimen is greater than a surface area the specimen;
a specimen potential measuring device configured to measure a surface potential of the specimen inside of the specimen chamber and obtain an output value from a detector when a voltage applied to the specimen stage is changed and while a potential difference between the specimen stage and the electrode disposed over the specimen stage is kept constant; and
a controller coupled to the specimen potential measuring device, configured to:
adjust a voltage to be applied to the specimen; and
when a fixed potential of the specimen measured outside the specimen chamber by another specimen potential device is equal to or more than a predetermined threshold value, control the specimen potential measuring device to selectively measure the surface potential of the specimen;
calculate a potential difference between the surface potential measured by the specimen potential measuring device and the fixed potential measured by the another potential measuring device as an offset potential; and
apply the offset potential to the specimen.

5. A charged particle beam device according to claim 4, wherein,
the another specimen potential measuring device is an electrometer disposed in a specimen replacement chamber to introduce a specimen into the specimen chamber.

6. A charged particle beam device comprising:
an electron source emitting a charged particle beam;
a specimen chamber in which a specimen stage holding a specimen irradiated by the charged particle beam is disposed;
an electrode disposed over the specimen stage, the electrode and the specimen stage sandwich the specimen and a surface area of the electrode facing the specimen is greater than a surface area of the specimen;
a specimen potential measuring device configured to measure a surface potential of the specimen inside of the specimen chamber and obtain an output value from a detector when a voltage applied to the specimen stage is changed and while a potential difference between the specimen stage and the electrode disposed over the specimen stage is kept constant; and
a controller coupled to the specimen potential measuring device, configured to:
adjust a voltage to be applied to the specimen;
when a fixed potential of the specimen measured outside the specimen chamber by another specimen potential device is equal to or more than a predetermined threshold value, control the specimen potential measuring device to selectively measure the surface potential of the specimen;
calculate a potential difference between the fixed potential and the surface potential, and add the potential difference to the fixed potential of the specimen to obtain a potential value; and
apply the potential value to the specimen.

7. A charged particle beam device according to claim 4, wherein:
the controller adjusts a voltage to be applied to the specimen to cancel the fixed potential or the surface potential.

8. A specimen potential measuring method of measuring a potential of a specimen outside a specimen chamber in which the specimen is to be irradiated by a charged particle beam, comprising the steps of:
providing a first specimen stage configured to hold a specimen to be irradiated by the charged particle beam and a first electrode are disposed inside the specimen chamber a second specimen stage and a second electrode are disposed outside of the specimen chamber, the first electrode and the first specimen stage sandwich the specimen and a surface area of the first electrode facing the specimen is greater than a surface area of the specimen, the specimen is disposed on the second specimen stage and the second electrode and the second specimen stage sandwich the specimen and a surface area the second electrode facing the specimen is greater than a surface area of the specimen, a distance between the first electrode and the first specimen stage is substantially equal to a distance between the second electrode and the second specimen stage;
disposing the specimen to be irradiated by the charged particle beam inside the specimen chamber on the second specimen stage;
maintaining a potential difference between the first electrode and the first specimen stage to be substantially equal to a potential difference between the second electrode and the second specimen stage; and
measuring, by an electrometer, a potential of the specimen while the specimen is disposed between the second electrode and the second specimen stage.

9. A specimen potential measuring method according to claim 8, wherein
when the measured potential is equal to or greater than a predetermined threshold value, a voltage to be applied to the specimen stage is adjusted to cancel the measured potential.

10. A charged particle beam device, comprising:
a first specimen stage configured to hold a specimen to be irradiated by a charged particle beam and a first electrode disposed inside a specimen chamber;
a second specimen stage and a second electrode disposed outside of the specimen chamber; and
an electrometer configured to measure a potential of the specimen outside of the specimen chamber,
wherein the first electrode and the first specimen stage sandwich the specimen and a surface area of the first electrode facing the specimen is greater than a surface area of the specimen,
wherein the specimen is disposed on the second specimen stage and the second electrode and the second specimen stage sandwich the specimen and a surface area the second electrode facing the specimen is greater than a surface area of the specimen facing,
wherein a distance between the first electrode and the first specimen stage is substantially equal to a distance between the second electrode and the second specimen stage,
wherein a potential difference between the first electrode and the first specimen stage is substantially equal to a potential difference between the second electrode and the second specimen stage, and
wherein the electrometer measures a potential of the specimen while the specimen is disposed between the second electrode and the second specimen stage.

11. A charged particle beam device according to claim 10, further comprising:
a controller to adjust, when the measured potential is equal to or greater than a predetermined threshold value, a voltage to be applied to the specimen stage to cancel the measured potential.

* * * * *